(12) United States Patent
Somma (10) Patent No.: US 11,810,839 B2
(45) Date of Patent: Nov. 7, 2023

(54) SEMICONDUCTOR PACKAGE WITH DIE STACKED ON SURFACE MOUNTED DEVICES

(71) Applicant: STMICROELECTRONICS S.r.l., Agrate Brianza (IT)

(72) Inventor: Cristina Somma, Cinisello Balsamo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/674,697

(22) Filed: Feb. 17, 2022

(65) Prior Publication Data

US 2022/0173018 A1 Jun. 2, 2022

Related U.S. Application Data

(62) Division of application No. 16/824,429, filed on Mar. 19, 2020, now Pat. No. 11,276,628, which is a division of application No. 15/925,477, filed on Mar. 19, 2018, now abandoned.

(51) Int. Cl.
*H01L 23/495* (2006.01)
*H01L 23/498* (2006.01)

(52) U.S. Cl.
CPC .... *H01L 23/49503* (2013.01); *H01L 23/4952* (2013.01); *H01L 23/49575* (2013.01); *H01L 23/49816* (2013.01)

(58) Field of Classification Search
None
See application file for complete search history.

(56) References Cited

U.S. PATENT DOCUMENTS

| | | | |
|---|---|---|---|
| 6,781,222 B2 | 8/2004 | Wu et al. |
| 6,867,492 B2 | 3/2005 | Auburger et al. |
| 7,023,085 B2 | 4/2006 | Pu |
| 7,545,026 B2 | 6/2009 | Six |
| 7,622,325 B2 | 11/2009 | Shim et al. |

(Continued)

FOREIGN PATENT DOCUMENTS

| | | |
|---|---|---|
| CN | 101118895 A | 2/2008 |
| CN | 101587884 A | 11/2009 |

(Continued)

*Primary Examiner* — Telly D Green
(74) *Attorney, Agent, or Firm* — SEED IP LAW GROUP LLP (57) ABSTRACT

One or more embodiments are directed to semiconductor packages and methods in which one or more electrical components are positioned between a semiconductor die and a surface of a substrate. In one embodiment, a semiconductor package includes a substrate having a first surface. One or more electrical components are electrically coupled to electrical contacts on the first surface of the substrate. A semiconductor die is positioned on the one or more electrical components, and the semiconductor die has an active surface that faces away from the substrate. An adhesive layer is on the first surface of the substrate and on the one or more electrical components, and the semiconductor die is spaced apart from the one or more electrical components by the adhesive layer. Wire bonds are provided that electrically couples the active surface of the semiconductor die to the substrate.

19 Claims, 6 Drawing Sheets

(56) References Cited

U.S. PATENT DOCUMENTS

| | | |
|---|---|---|
| 8,102,041 B2 | 1/2012 | Lin |
| 8,115,285 B2 | 2/2012 | Chen et al. |
| 8,120,152 B2 | 2/2012 | Chang Chien et al. |
| 8,288,201 B2 | 10/2012 | Pagaila et al. |
| 8,445,999 B2 | 5/2013 | Cho |
| 8,492,883 B2 | 7/2013 | Chien et al. |
| 8,916,969 B2 | 12/2014 | Chen et al. |
| 9,780,069 B2 | 10/2017 | Haga et al. |
| 10,163,850 B2 | 12/2018 | Haga et al. |
| 10,211,172 B2 | 2/2019 | Srivastava et al. |
| 2005/0230842 A1 | 10/2005 | Swanson et al. |
| 2006/0081967 A1 | 4/2006 | Ha et al. |
| 2006/0145339 A1 | 7/2006 | Yang et al. |
| 2007/0194419 A1 | 8/2007 | Ozawa |
| 2007/0215996 A1 | 9/2007 | Otremba |
| 2009/0230523 A1 | 9/2009 | Chien et al. |
| 2009/0230524 A1 | 9/2009 | Chien et al. |
| 2009/0230525 A1 | 9/2009 | Chang Chien et al. |
| 2009/0230526 A1 | 9/2009 | Chen et al. |
| 2009/0267220 A1 | 10/2009 | Kuhlman et al. |
| 2010/0207267 A1 | 8/2010 | Lin |
| 2011/0193243 A1* | 8/2011 | Gupta ................... H01L 23/66 257/E23.116 |
| 2013/0026623 A1 | 1/2013 | Chen et al. |
| 2015/0200181 A1 | 7/2015 | Haga et al. |
| 2015/0262944 A1 | 9/2015 | Srivastava et al. |
| 2016/0099214 A1 | 4/2016 | Dalal et al. |
| 2016/0104662 A1 | 4/2016 | Prajuckamol et al. |
| 2017/0069551 A1 | 3/2017 | Fukayama et al. |
| 2017/0133302 A1 | 5/2017 | Truhitte et al. |
| 2018/0005981 A1 | 1/2018 | Haga et al. |
| 2018/0145236 A1 | 5/2018 | Huang et al. |
| 2020/0350227 A1 | 11/2020 | Gogineni et al. |

FOREIGN PATENT DOCUMENTS

| | | |
|---|---|---|
| CN | 101663749 A | 3/2010 |
| CN | 102420217 A | 4/2012 |
| CN | 107799511 A | 3/2018 |
| CN | 209785926 U | 12/2019 |
| JP | 2004047811 A | 2/2004 |

* cited by examiner

SEMICONDUCTOR PACKAGE WITH DIE STACKED ON SURFACE MOUNTED DEVICES

BACKGROUND

Technical Field

Embodiments of the present disclosure are directed to semiconductor packages and methods in which one or more electrical components are positioned between a semiconductor die and a surface of a substrate.

Description of the Related Art

Semiconductor packages, such as system in package (SiP) devices come in many forms, including ball grid array (BGA) packages and land grid array (LGA) packages. BGA packages generally include an array of solder balls on an underside of a substrate in the package, which are used to electrically couple the package to a printed circuit board (PCB). Similarly, LGA packages generally include an array of contacts on an underside of a substrate in the package, which are used to electrically couple the package to a PCB.

BGA and LGA packages are typically limited in terms of space, which in turn limits a number of components that can be integrated in such packages. For example, such packages typically include a top metal layer on which a semiconductor die, wire bonds, signal routing paths, ground planes, a metal lid and other components are disposed. The top metal layer thus has very little, if any, available space for additional components, e.g., surface mounted components, to be integrated in the package. The bottom metal layer of such packages is similarly space limited, as the bottom metal layer is typically dedicated for connecting the package to a PCB through either the solder balls (e.g., in BGA packages) or lands (e.g., as in LGA packages).

Miniaturization of semiconductor packaging is a continuing trend in the industry; however, package miniaturization generally does not allow for an increase in integration of components in such packages, since package size generally increases as more components are integrated in the package. More particularly, a surface area or footprint of the package typically increases by integrating surface mounted devices on the top layer of the package. An alternative integration technique is to embed one or more electrical components in the substrate of the package; however, this technique may be less desirable due to added expense in terms of manufacturing yield.

BRIEF SUMMARY

Embodiments of the present disclosure are generally directed to semiconductor packages and methods in which one or more electrical components are positioned between a semiconductor die and a surface of a substrate.

In some embodiments, one or more surface mounted devices (SMDs) are positioned on a surface of a substrate, and the semiconductor die is positioned on or over the one or more SMDs, with an active surface of the semiconductor die facing away from the SMDs. That is, a non-active surface of the semiconductor die faces the SMDs. One or more wire bonds are connected between the active surface of the semiconductor die and electrical contacts on the substrate.

In some embodiments, a cavity may be formed in a substrate, such that the cavity extends through an upper surface of the substrate. One or more SMDs are positioned in the cavity, and a semiconductor die is positioned over the SMDs, with the active surface of the semiconductor die facing away from the SMDs.

In some embodiments, one or more SMDs and one or more solder balls are positioned on a surface of a substrate. A semiconductor die is positioned on or over the SMDs and solder balls, and the solder balls at least partially support the semiconductor die. The active surface of the semiconductor die may be facing away from the surface of the substrate, and wire bonds may be formed that connect the semiconductor die to electrical contacts of the substrate.

In some embodiments, a spacer, such as a dummy die, is positioned on a surface of the substrate. A semiconductor die is positioned on the spacer, and the spacer separates the semiconductor die from the surface of the substrate. The spacer has a smaller surface area than does the semiconductor die, and one or more gaps are thus formed between the spacer and the semiconductor die. One or more SMDs may thus be positioned on the surface of the substrate in the gaps adjacent to the spacer, with the SMDs being between the semiconductor die and the substrate. The active surface of the semiconductor die may be facing away from the spacer, and one or more wire bonds may be connected between the active surface of the semiconductor die and electrical contacts on the substrate.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with leadframes and chip packaging have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in the specification and the appended claims, the singular forms "a," "an," and "the" include plural referents unless the context clearly dictates otherwise. It should also be noted that the term "or" is generally employed in its broadest sense, that is, as meaning "and/or" unless the context clearly dictates otherwise.

In various embodiments, the present disclosure provides semiconductor packages having one or more electrical components, such as surface mounted devices, positioned between a semiconductor die and a surface of a substrate. The substrate may be a BGA substrate, i.e., with an array of solder balls on an underside of the substrate. In other embodiments, the substrate may be a LGA substrate, i.e., with an array of contacts or leads on an underside of the substrate. The electrical components may be positioned in a cavity of the substrate, or may be positioned on an upper surface of the substrate. The semiconductor die may be supported by the electrical components and/or by one or more supporting structures, such as solder balls, a dummy die, or any spacer. In some embodiments, the semiconductor die is attached to the electrical components by glue, while in other embodiments, the semiconductor die may be secured in place over the electrical components by an encapsulation layer, such as a molding compound.

Figure 1:
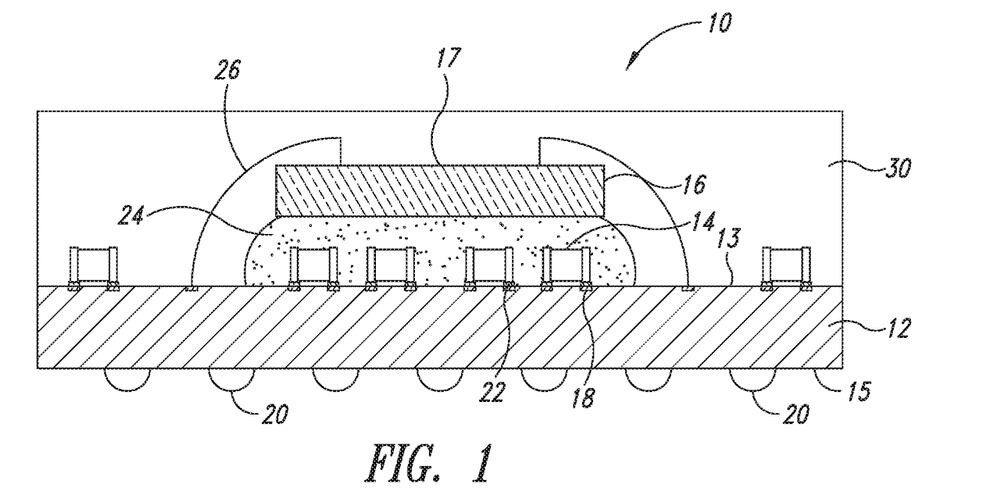
FIG. 1 is a cross-sectional view of a semiconductor package including a semiconductor die attached to a plurality of electrical components by glue that encapsulates the electrical components, in accordance with one or more embodiments of the present disclosure.

FIG. 1 shows a cross-sectional view of a semiconductor package 10, in accordance with one or more embodiments of the present disclosure. The package 10 includes a substrate 12, one or more electrical components 14, and a semiconductor die 16.

The substrate 12 has a first surface 13 (e.g., an upper surface) and a second surface 15 (e.g., a lower surface) that is opposite to the first surface. The substrate 12 includes electrical contacts 18, or pads, on the first surface 13, and electrical contacts 20, such as solder balls, on the second surface 15. In the illustrated embodiment, the package 10 is a ball grid array (BGA) package having an array of solder balls which serve as the electrical contacts 20 on the underside of the package 10; however, it should be readily appreciated that in other embodiments, the electrical contacts 20 may be, for example, lands in a land grid array (LGA) package.

The substrate 12 may be any substrate suitable for electrically coupling electrical components or devices on the first surface 13 to one or more other electrical components or devices on the first surface 13 and/or to one or more of the electrical contacts 20 on the second surface 15 of the substrate 12. More particularly, the substrate 12 may include a variety of conductive paths that electrically couple one or more of the electrical contacts 18 on the first surface 13 to one or more of the electrical contacts 20 on the second surface 15. The substrate 12 may further include conductive paths that electrically couple one or more of the electrical contacts 18 on the first surface 13 to other electrical contacts 18 on the first surface 13. The conductive paths may include, for example, one or more vias or conductive through-holes that extend through the substrate 12, laterally extending wiring paths that are formed in one or more inner layers of the substrate 12 (i.e., layers that are between the first and second surfaces 13, 15), conductive signal paths that are formed on the first surface 13, or any other conductive path on or in the substrate 12. In one or more embodiments, the substrate 12 is a multi-layer printed circuit board (PCB) having a variety of conductive paths formed between the electrical contacts 18 on the first surface 13 and the electrical contacts 20 on the second surface 20. Such a multi-layer PCB may further include conductive paths between one or more of the electrical contacts 18 on the first surface 13 and other electrical contacts 18 on the first surface 13.

One or more electrical components 14 are positioned on and electrically coupled to the first surface 13 of the substrate 12. For example, the electrical components 14 may be electrically coupled to respective electrical contacts 18 by a conductive material, such as solder paste 22.

The electrical components 14 may be any surface mount devices (SMDs) that can be mounted on a surface (e.g., on the first surface 13 of the substrate 12) using surface mount technology (SMT). In one or more embodiments, the electrical components 14 may be passive electrical components, including resistors, capacitors, and inductors. As shown in FIG. 1, the electrical components 18 may be two-terminal components; however, it should be readily appreciated that three or more terminal components may be included as electrical components 14 in various embodiments. Moreover, the electrical components 14 on the first surface 13 of the substrate 12 may have various different dimensions. For example, some of the electrical components 14 may have different heights, widths, and/or thicknesses.

As shown in FIG. 1, an adhesive, such as glue 24, may cover one or more of the electrical components 14. The glue 24 may be, for example, a glob top, which forms an electrically insulating protective dome over the electrical components 14. The semiconductor die 16 is positioned on the glue 24 and is mechanically attached to the underlying electrical components 14 by the glue 24. As shown in FIG. 1, the glue 24 may substantially surround or encapsulate the electrical components 14 that are positioned between the semiconductor die 16 and the substrate 12. The semiconductor die 16 is thus supported in the package 10 by the electrical components 14. As noted previously, the electrical components 14 may have various different dimensions, including height; however, in the implementation shown in FIG. 1, it may be desirable that the electrical components 14 that underlie the semiconductor die 16 have a substantially same height in order to provide a relatively uniform, flat supporting surface for placement of the semiconductor die 16.

Additional electrical components 14 may be positioned on the first surface 13 of the substrate 12 and spaced apart laterally from the electrical components 14 that are positioned beneath the semiconductor die 16, as shown.

The semiconductor die 16 is made from a semiconductor material, such as silicon. The semiconductor die 16 includes an active surface 17 that includes one or more electrical components, such as integrated circuits. The integrated circuits may be analog or digital circuits implemented as active devices, passive devices, conductive layers, and dielectric layers formed within the semiconductor die 16 and electrically interconnected according to the electrical design and function of the semiconductor die 16. In various implementations, the semiconductor die 16 may include electrical components and/or circuitry that form an application specific integrated circuit (ASIC).

Conductive wires 26 or wire bonds electrically couple the active surface 17 of the semiconductor die 16 to the substrate 12. For example, the conductive wires 26 may electrically couple respective bond pads (not shown) on the active surface 17 of the semiconductor die 16 to respective electrical contacts 18 on the first surface 13 of the substrate 12.

An encapsulation layer 30 is formed over the semiconductor die 16, and covers the semiconductor die 16 and the conductive wires 26 to form a package body. The encapsulation layer 30 extends from some height over the active surface 17 of the semiconductor die 16 to at least the first surface 13 of the substrate 12, and substantially fills any spaces therebetween, as shown. In some embodiments, the encapsulation layer 30 may further be provided on side surfaces of the substrate 12 and/or on the second surface 15 of the substrate 12, e.g., between the electrical contacts 20. The encapsulation layer 30 is an electrically insulating material that protects the electrical components 14, semiconductor die 16, conductive wires 26, first surface 13 of the substrate 12, and any other electrical components or wiring from damage, such as corrosion, physical damage, moisture damage, or the like. In one or more embodiments, the encapsulation layer 30 is a molding compound, which may include, for example, a polymer resin. The electrical components 14 that are between the semiconductor die 16 and the substrate 12 are electrically isolated from the semiconductor die 16 by the glue 24 and/or the encapsulation layer 30.

The exposed electrical contacts 20 on the second surface 15 of the substrate 12, which may be solder balls in a BGA package, facilitate electrical and/or mechanical coupling of the package 10 to external circuitry, such as to an external printed circuit board.

By stacking the semiconductor die 16 over one or more electrical components 14, increased integration of components is provided in the semiconductor package 10 without increasing the footprint of the package 10.

Figure 2:
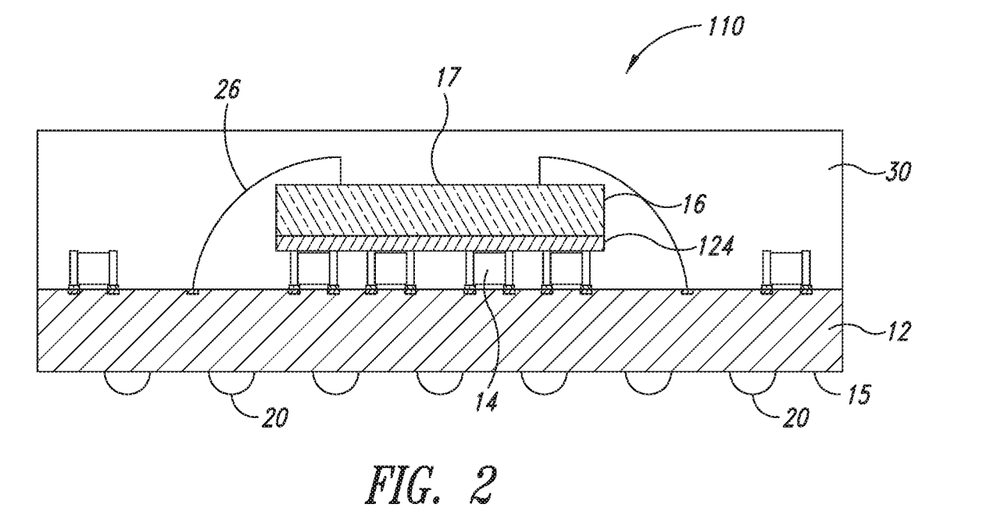
FIG. 2 is a cross-sectional view of a semiconductor package including a semiconductor die attached to a plurality of electrical components that are molding underfill, in accordance with one or more embodiments.

FIG. 2 shows a cross-sectional view of another semiconductor package 110 according to one or more embodiments of the present disclosure. The semiconductor package 110 shown in FIG. 2 is similar in structure and function to the semiconductor package 10 shown in FIG. 1, except for the differences that will be discussed below. The features shared by the semiconductor packages 110 and 10 will not be described herein again in the interest of brevity.

The main difference between the semiconductor package 110 shown in FIG. 2 and the semiconductor package 10 shown in FIG. 1 is that the semiconductor package 110 does not include the glue 24 encapsulating the electrical components 14 between the semiconductor die 16 and the first surface 13 of the substrate 12. Instead, the semiconductor die 16 is attached to upper surfaces of the underlying electrical components 14 by an adhesive, such as die attach film 124. As an alternative to die attach film 124, any adhesive, including glue, may be positioned on the upper surfaces of the electrical components 14, and the semiconductor die 16 may be secured to the electrical components 14 by the adhesive.

Further, instead of glue 24 being positioned between neighboring electrical components 14 that underlie the semiconductor die 16, the spaces between the neighboring electrical components is filled by the encapsulation layer 30 in the semiconductor package 110. This may be accomplished, for example, by a molding underfill process, in which the encapsulation layer 30, e.g., molding material, is used to both underfill and over mold the structure in a same step.

Figure 3:
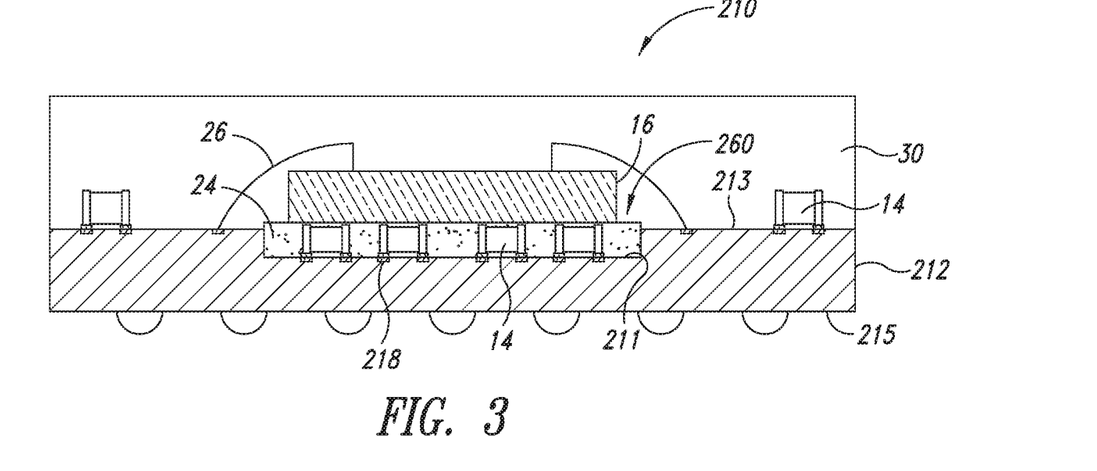
FIG. 3 is a cross-sectional view of a semiconductor package including electrical components positioned in a cavity of a substrate, and a semiconductor die positioned on the electrical components, in accordance with one or more embodiments.

FIG. 3 shows a cross-sectional view of yet another semiconductor package 210 according to one or more embodiments of the present disclosure. The semiconductor package 210 shown in FIG. 3 is similar in structure and function to the semiconductor package 10 shown in FIG. 1, except for the differences that will be discussed below. The features shared by the semiconductor packages 110 and 10 will not be described herein again in the interest of brevity.

The main difference between the semiconductor package 210 shown in FIG. 3 and the semiconductor package 10 shown in FIG. 1 is that the semiconductor package 210 includes a modified substrate 212 in which a cavity 260 is formed. The cavity 260 extends through the first surface 213 (e.g., upper surface) of the substrate 212 and defines a third surface 211 that forms a bottom surface of the cavity 260. The third surface 211 is between the first surface 213 and the second surface 215, as shown. That is, the cavity 260 extends only partially into the substrate 212.

Another difference is that one or more electrical components 14 are positioned in the cavity 260. The electrical components 14 are electrically and mechanically coupled to the substrate 212 in the same way as discussed above with respect to FIG. 1, e.g., the electrical components 14 may be coupled to respective electrical contacts that are exposed on the surface of the semiconductor die 212. However, due to the cavity 260 in substrate 212, the electrical components 14 that underlie the semiconductor die 16 may be coupled, e.g., by solder paste 22, to electrical contacts 218 that are exposed on the third surface 211 of the substrate 212. That is, the electrical contacts 218 may be formed in the bottom surface of the cavity 260. For example, the substrate 212 may be a multi-layer PCB, and the cavity 260 may be formed through one or more of the layers, with electrical contacts 218 being exposed in the bottom surface of the cavity 260. Accordingly, the electrical components 14 in the cavity 260 may be electrically coupled to the substrate 212 by the electrical contacts 218 in the cavity 260.

In some embodiments, the electrical components 14, once positioned in the cavity 260 and electrically coupled to the respective electrical contacts 218, may extend to a height that is substantially coplanar with the first surface 213. In other embodiments, the electrical components 14 may extend from the third surface 211 to a height that is above or below the first surface 213. This may depend on the height of the electrical components that are selected to be positioned in the cavity 260. All of the electrical components in the cavity 260 may have a substantially same height, which provides a relatively uniform, flat surface for attaching the semiconductor die 16. However, in some embodiments, the electrical components 14 in the cavity 260 may have various different heights.

The electrical components 14 in the cavity 260 may be encapsulated by glue 24, which may substantially fill the cavity 260 and may extend between and around the electrical components 14. The semiconductor die 16 is positioned on the glue 24 and is mechanically attached to the underlying electrical components 14 by the glue 24.

Some embodiments do not include the glue 24 encapsulating the electrical components 14 in the cavity 260. Instead, in some embodiments, the semiconductor die 16 is attached to upper surfaces of the underlying electrical components 14 by an adhesive, such as a die attach film or other adhesive, similar to the implementation shown in FIG. 2. In such embodiments, the spaces between neighboring electrical components 14 in the cavity 260 may be filled by the encapsulation layer 30 in the semiconductor package 210.

Figure 4:
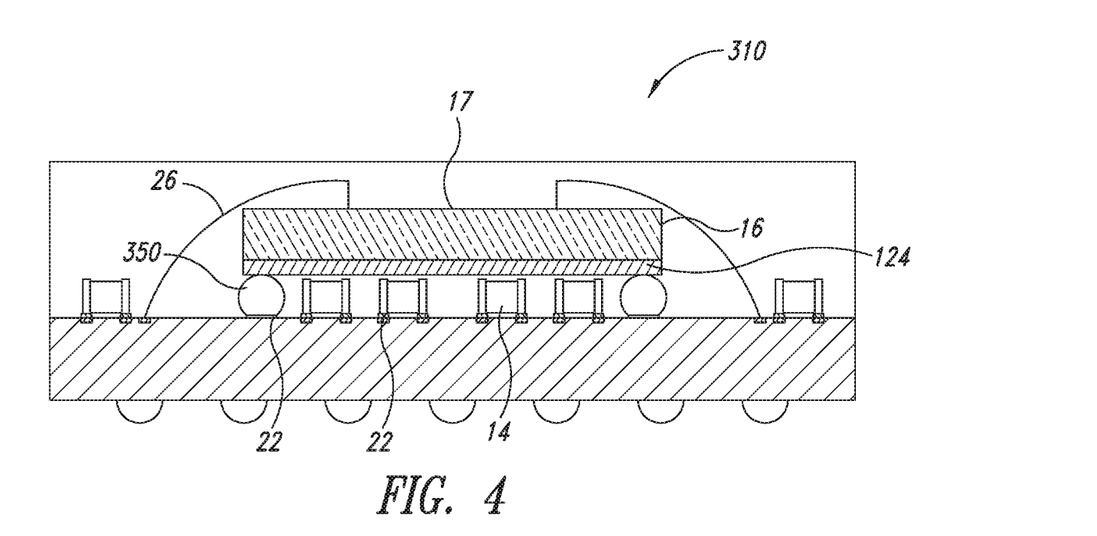
FIG. 4 is a cross-sectional view of a semiconductor package including a semiconductor die spaced apart from a substrate by solder balls, and a plurality of electrical components positioned between the die and the substrate, in accordance with one or more embodiments.

FIG. 4 shows a cross-sectional view of yet another semiconductor package 310 according to one or more embodiments of the present disclosure. The semiconductor package 310 shown in FIG. 4 is similar in structure and function to the semiconductor package 110 shown in FIG. 2, except that the semiconductor package 310 includes spacers 350, which may be solder balls (as shown) or any other pillars or other structure suitable to support the semiconductor die 16. The spacers 350 are attached to the first surface 13 of the substrate 12, for example, by an adhesive such as solder paste 22. The spacers 350 may be positioned adjacent to a periphery of the semiconductor die 16. For example, one or more spacers 350 may be positioned under each side edge of the semiconductor die 16. In an example where the semiconductor die 16 is rectangular from a top view, one or more spacers 350 may be positioned below each of four sides of the semiconductor die 16.

The semiconductor die 16 may be attached to the spacers 350 by an adhesive 124, such as a die attach film, glue, or any other suitable adhesive. The spacers 350 may have a height that is greater than the heights of the electrical components 14 that are positioned between the first surface 13 of the substrate 12 and the semiconductor die 16. This allows the semiconductor die 16 to be spaced apart from the electrical components 14, which further allows for electrical components 14 of different types (e.g., resistors, capacitors, inductors, etc.) having varying heights to be positioned below the semiconductor die 16, since the spacers 350 stably support the semiconductor die 16 rather than the electrical components 14.

The encapsulation layer 30 may be formed by molding underfill, and may cover the semiconductor die 16, the conductive wires 26, and the electrical components 14 disposed below the semiconductor die 16, as well as one or more electrical components 14 disposed on the substrate 12 and spaced apart laterally from the semiconductor die 16.

It should be noted that the spacers 350, such as solder balls, are not electrically coupled to the active surface 17 of the semiconductor die 16. Instead, the active surface 17 faces away from the spacers 350 and is electrically coupled only to the substrate 12, e.g., by conductive wires 26. That is, the spacers 350 provide only mechanical support to the semiconductor die 16, e.g., to support the semiconductor die 16 in a position that is spaced apart from the substrate 12 and the electrical components 14 underlying the semiconductor die 16.

Figure 5:
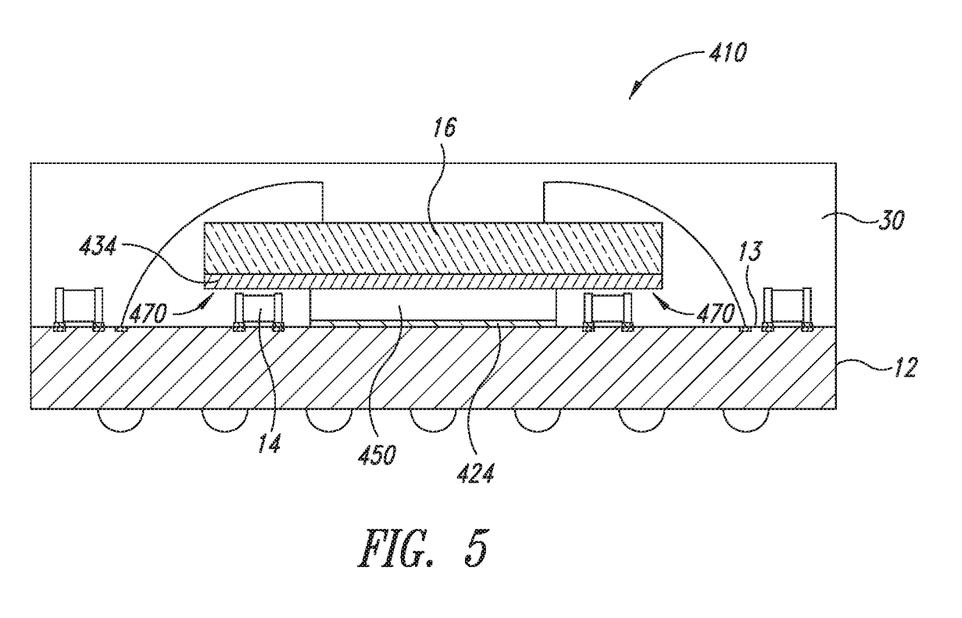
FIG. 5 is a cross-sectional view of a semiconductor package including a semiconductor die spaced apart from a substrate by a spacer, and a plurality of electrical components positioned between the die and the substrate, in accordance with one or more embodiments.

FIG. 5 shows a cross-sectional view of yet another semiconductor package 410 according to one or more embodiments of the present disclosure. The semiconductor package 410 shown in FIG. 5 is similar in structure and function to the semiconductor package 310 shown in FIG. 4, except that the semiconductor package 410 includes a spacer 450 that is positioned below a central portion of the semiconductor die 16, as opposed to the spacers 350 positioned near a periphery of the semiconductor die 16 in the semiconductor package 310.

The spacer 450 may be any structure suitable to support the semiconductor die 16 in a position that is spaced apart from the first surface 13 of the substrate 12. In one or more embodiments, the spacer 450 is a dummy die. The dummy die may be, for example, a piece of a semiconductor material such as silicon that is not electrically connected to other circuitry in the package 410. For example, the dummy die may not have an active surface or electrical components or circuitry formed in the dummy die. Instead, the dummy die is used in the semiconductor package 410 only as a mechanical spacer to support the semiconductor die 16 in a position that is spaced apart from the first surface 13 of the substrate 12.

The spacer 450 may be attached to the first surface 13 of the substrate 12 by an adhesive 424. The adhesive 424 may be any adhesive material suitable to attach the spacer 450 to the first surface 13 of the substrate 12, and may be, for example, a glue, a die attach film, or the like.

The semiconductor die 16 may similarly be attached to an upper surface of the spacer 450 by an adhesive 434. The adhesive 434 may be any adhesive material suitable to attach the semiconductor die 16 to the spacer 450, and may be, for example, a glue, a die attach film, or the like. The adhesive 434 may be the same material used as the adhesive 424, or it may be a different adhesive material. For example, in some embodiments, the adhesive 424 may be glue, while the adhesive 434 may be a die attach film.

The semiconductor die 16 may have a width that is greater than the width of the spacer 450, as shown. Accordingly, the semiconductor die 16 may be centered on the spacer 450, and overhang regions 470 are formed where the semiconductor die 16 extends outwardly beyond the edges of the spacer 450. In the overhang regions 470, the semiconductor die 16 is suspended over the first surface 13 of the substrate 12.

One or more electrical components 14 may be positioned on the first surface 13 of the substrate 12, with the electrical components 14 being between the substrate 12 and the semiconductor die 16 in the overhang regions 470. The lower surface of the semiconductor die 16 and/or the adhesive 434 may be spaced apart from upper surfaces of the electrical components 14 in the overhang regions 470, as shown. Alternatively, one or more of the electrical components 14 may have upper surfaces that are substantially coplanar with the upper surface of the spacer 450, such that the spacer 450 as well as one or more of the electrical components provide mechanical support for the semiconductor die 16.

The overhang regions 470 allow for placement of electrical components 14 having various sizes between the semiconductor die 16 and the substrate 12. That is, since the semiconductor die 16 is supported by the spacer 450 (e.g., instead of by the electrical components 14), it does not matter whether the components 14 have different heights, as the spacer 450 provides a uniform, flat surface for mounting the semiconductor die 16. Moreover, it does not matter if the electrical components 14 are distributed in a non-uniform manner below the semiconductor die 16, since the semiconductor die 16 is already stably supported by the spacer 450.

Although the various semiconductor packages illustrated in FIGS. 1 through 5 are shown as BGA packages, e.g., with an array of solder balls on the underside of the packages, it should be readily appreciated that in other embodiments, the packages shown in each of FIGS. 1 through 5 may be LGA packages, with lands as electrical contacts on the underside of the packages.

FIGS. 6A-6D are cross-sectional views illustrating various stages of a method of manufacturing semiconductor packages, such as the semiconductor package 10 of FIG. 1, in accordance with one or more embodiments.

Figure 6A:
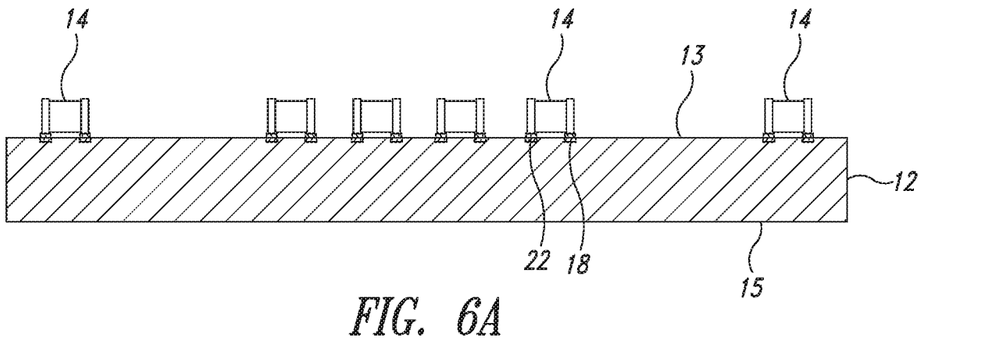
FIGS. 6A-6D are cross-sectional views illustrating a method of manufacturing the semiconductor package shown in FIG. 1, in accordance with one or more embodiments.

As shown in FIG. 6A, electrical components 14 are coupled to a first surface 13 of a substrate 12. More particularly, the electrical components 14 have leads or conductive contacts that are electrically coupled to respective electrical contacts 18 formed on or in the first surface 13 of the substrate 12. The electrical components 14 may be coupled to the electrical contacts 18 by a conductive material, such as solder paste 22.

Although not shown, the substrate 12 includes a variety of conductive paths, such as vias, conductive through-holes, conductive signal paths or layers and the like, that electrically couple the electrical contacts 18 on the first surface 13 to one or more other electrical contacts 18 on the first surface and/or to conductive pads on the second surface 15. In one or more embodiments, the substrate 12 may be a multi-layer PCB.

Figure 6B:
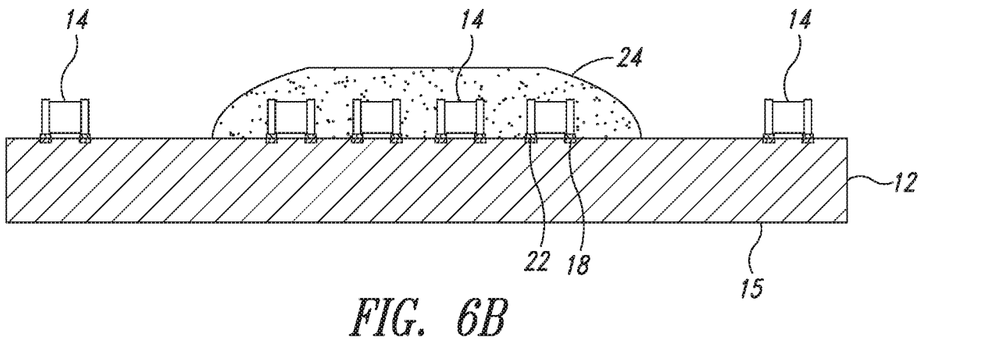

As shown in FIG. 6B, an adhesive, such as glue 24, may be formed over at least some of the electrical components 14. In particular, the glue 24 is formed over a grouping of electrical components 14, shown near the middle of the structure of FIG. 6B, which will later form a platform for mounting the semiconductor die 16. The glue 24 may be, for example, a glob top, which forms an electrically insulating protective dome over the electrical components 14. The glue 24 may be dispensed on the electrical components 14 and may form a dome shape, which may be flattened after dispensing, as shown. The glue 24 substantially surrounds or encapsulates the electrical components 14.

Figure 6C:
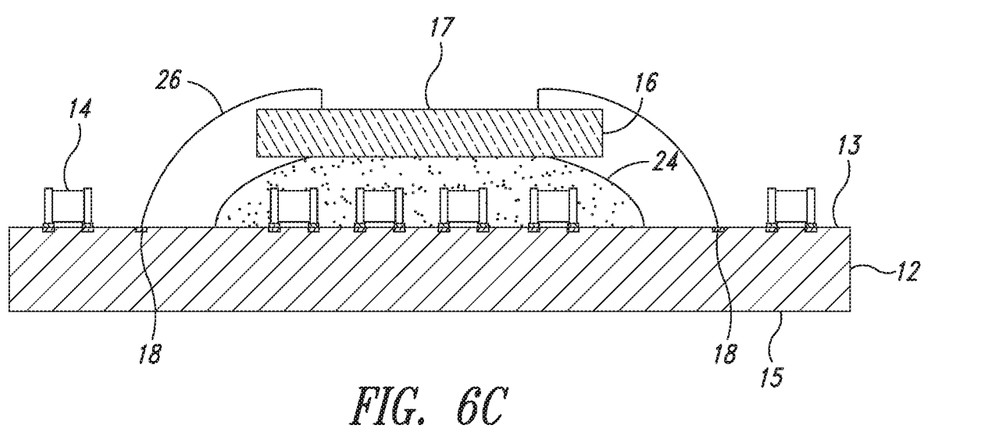

As shown in FIG. 6C, a semiconductor die 16 is positioned on the glue 24 and is mechanically attached to the underlying electrical components 14 by the glue 24. The semiconductor die 16 has an active surface 17 that faces away from the first surface 13 of the substrate 12.

Conductive wires 26 are formed, e.g., by wiring bonding, between leads or bond pads on the active surface 17 of the semiconductor die 12 and respective electrical contacts 18 on the first surface 13 of the substrate 12.

Figure 6D:
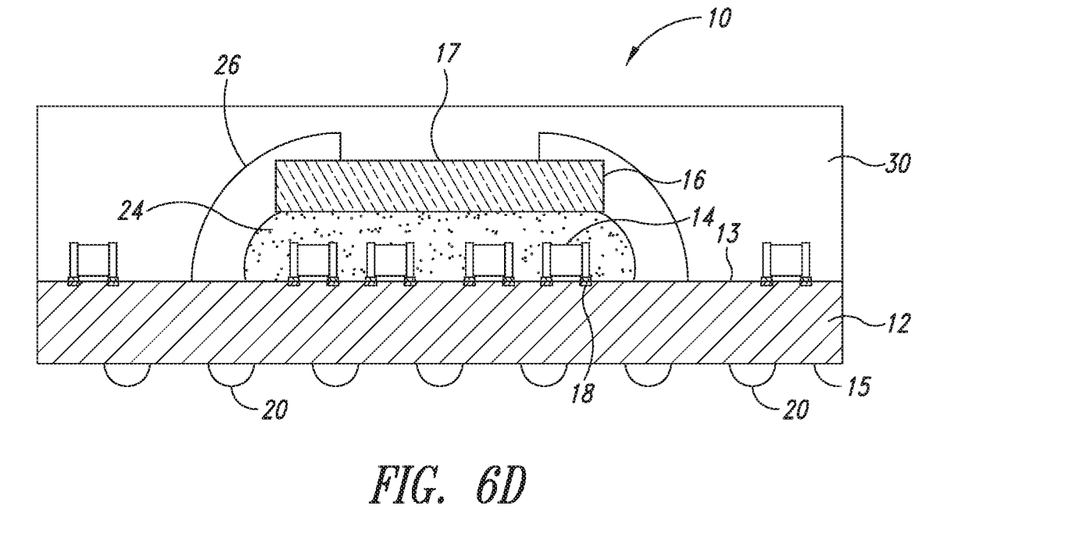

As shown in FIG. 6D, an encapsulation layer 30 is formed over the semiconductor die 16, and covers the semiconductor die 12 and the conductive wires 26. The encapsulation layer 30 may be formed by a molding underfill process, and the encapsulation layer 30 may substantially fill any spaces between an upper surface of the encapsulation layer 30 and the first surface 13 of the substrate 12. In some embodiments, the encapsulation layer 30 may further be provided on side surfaces of the substrate 12 and/or on portions of the second surface 15 of the substrate 12.

Also as shown in FIG. 6D, electrical contacts 20 are formed on the second surface 15 of the substrate 12, thereby forming a completed semiconductor package 10. The electrical contacts 20 may be, for example, solder balls in a BGA package as shown in FIG. 6D. In other embodiments, the electrical contacts 20 may be lands in a LGA package. In some embodiments, the electrical contacts 20 are pre-formed, or are otherwise formed on the second surface 15 of the substrate 12 prior to placement of the electrical components 14 on the first side 13 of the substrate as shown in FIG. 6A.

The method of manufacturing semiconductor packages illustrated in FIGS. 6A-6D may be modified to manufacture the semiconductor package 110 shown in FIG. 2. For example, to manufacture the semiconductor package 110, the formation of glue 24 as shown in FIG. 6B may be omitted. Instead, the semiconductor die 16 may be attached to the upper surfaces of the underlying electrical components 14 by an adhesive, such as die attach film. Further, instead of glue 24 being positioned between neighboring electrical components 14 under the semiconductor die 16, the spaces between neighboring electrical components may be filled by the encapsulation layer 30.

Similarly, the semiconductor packages 310 and 410 shown in FIGS. 4 and 5, respectively, may be formed by modified versions of the method shown in FIGS. 6A-6D. In particular, spacers 350 or spacers 450 may be positioned on the first surface 13 of the substrate 12, for example, in a same step as the electrical components 14 are positioned on the substrate 12 shown in FIG. 6A. The formation of glue 24 as shown in FIG. 6B may be omitted. Instead, the semiconductor die 16 may be attached to upper surfaces of either the spacers 350 (e.g., to form the semiconductor package 310) or the spacer 450 (e.g., to form the semiconductor package 410) by adhesives 124 or 434, respectively. The conductive wires 26 and the encapsulation layer 30 are formed in substantially the same manner as previously described.

Figure 7A:
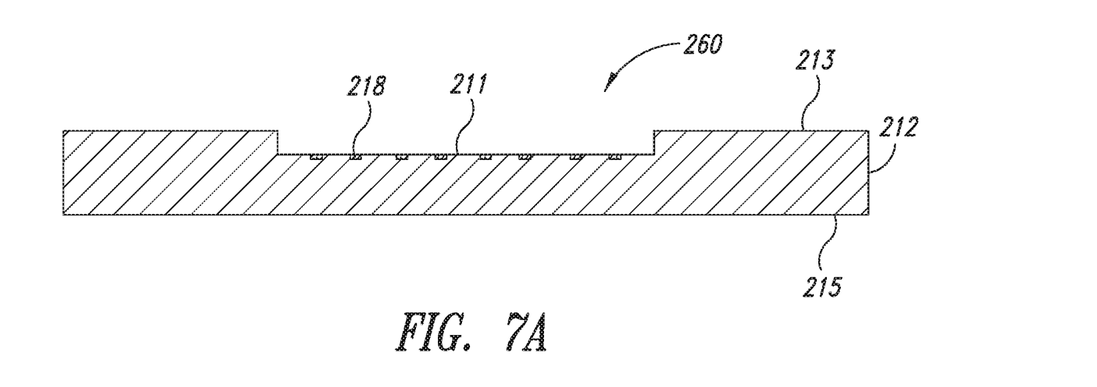
FIGS. 7A-7C are cross-sectional views illustrating a method of manufacturing the semiconductor package shown in FIG. 3, in accordance with one or more embodiments.
Figure 7B:
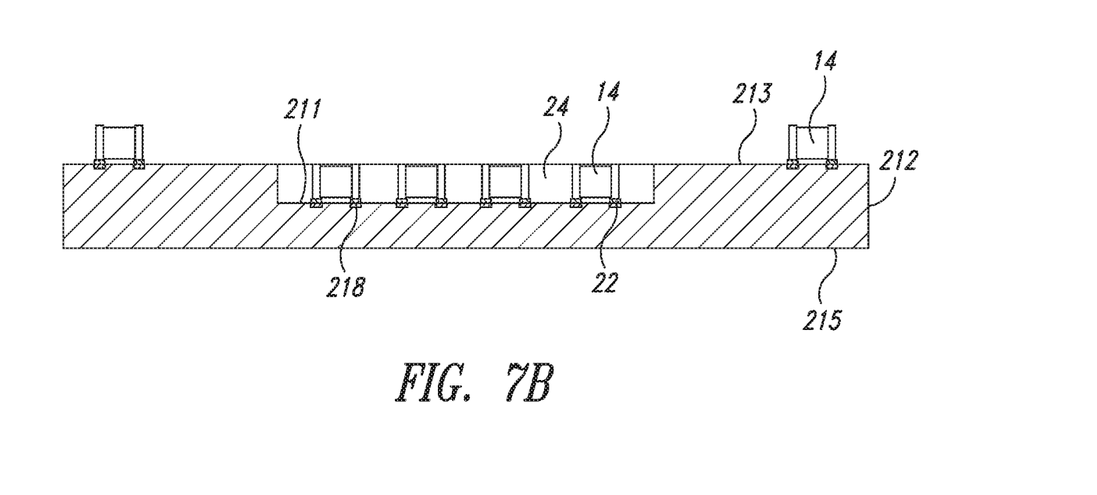
Figure 7C:
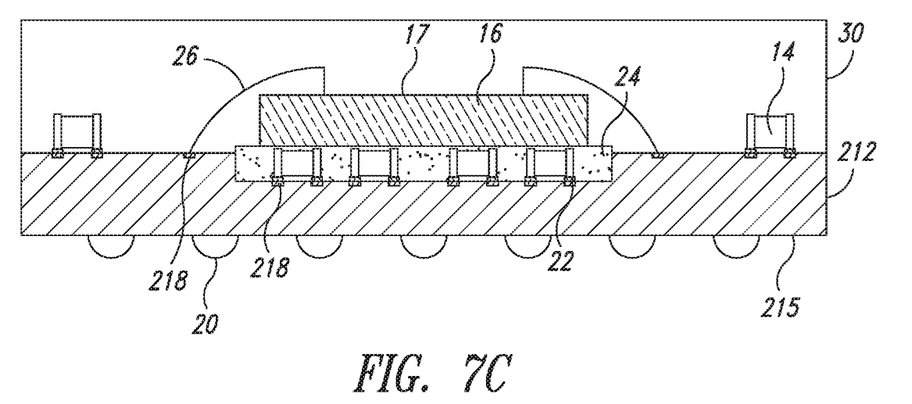

FIGS. 7A-7C are cross-sectional views illustrating various stages of a method of manufacturing semiconductor packages including a cavity in the substrate, such as the semiconductor package 210 of FIG. 3, in accordance with one or more embodiments.

As shown in FIG. 7A, a cavity 260 is formed in the substrate 212. The cavity 260 extends through the first surface 213 (e.g., upper surface) of the substrate 212 and defines a third surface 211 that forms a bottom surface of the cavity 260. The third surface 211 is between the first surface 213 and the second surface 215, as shown. The cavity 260 extends only partially into the substrate 212.

One or more electrical contacts 218 are exposed on the third surface 211 by the cavity 260. For example, the substrate 212 may be a multi-layer PCB, and the cavity 260 may be formed through one or more of the layers, with electrical contacts 218 being exposed on or in the third surface 211 of the cavity 260.

As shown in FIG. 7B, electrical components 14 are electrically and mechanically coupled to the substrate 212, in the cavity 260. More particularly, the electrical components 14 are coupled to respective electrical contacts 218 that are exposed on the third surface 211 of the semiconductor die 212 in the cavity 260. The electrical components 14 in the cavity 260 may be coupled, e.g., by solder paste 22, to the respective electrical contacts 218 that are exposed on the third surface 211 of the substrate 212. In some embodiments, one or more electrical components 14 are coupled to the first surface 211 of the semiconductor die 212.

The electrical components 14 positioned in the cavity 260 may be sized such that upper surfaces of the electrical components 14 are substantially coplanar with the first surface 213 of the semiconductor die 212. In other embodiments, the electrical components 14 may extend from the third surface 211 to a height that is above or below the first surface 213.

Glue 24 is formed in the cavity 260 and may substantially fill the cavity 260, such that glue 24 covers side surfaces of the electrical components 14 and extends between and around the electrical components 14. In some embodiments, the glue 24 may further cover upper surfaces of the electrical components 14 in the cavity 260.

As shown in FIG. 7C, a semiconductor die 16 is positioned on the electrical contacts 14 in the cavity 260 and/or on the glue 24, and the semiconductor die 16 may be mechanically attached to the underlying electrical components 14 by the glue 24.

Some embodiments do not include the glue 24 in the cavity 260. Instead, in some embodiments, the semiconductor die 16 is attached to upper surfaces of the underlying electrical components 14 by an adhesive, such as a die attach film or other adhesive. In such embodiments, the spaces between neighboring electrical components 14 in the cavity 260 may be filled by the encapsulation layer 30 in the semiconductor package 210.

Conductive wires 26 or wire bonds are formed that couple the active surface 17 of the semiconductor die 16 to the substrate 212. For example, the conductive wires 26 may electrically couple respective bond pads (not shown) on the active surface 17 of the semiconductor die 16 to respective electrical contacts 218 on the first surface 213 of the substrate 212.

Electrical contacts 20 are formed on the second surface 215 of the substrate 212. The electrical contacts 20 may be, for example, solder balls in a BGA package as shown in FIG. 7C, or in other embodiments, the electrical contacts 20 may be lands in a LGA package. In some embodiments, the electrical contacts 20 are formed on the second surface 215 of the substrate 212 prior to placement of the electrical components 14 on the first surface 213 of the substrate 212.

An encapsulation layer 30 is formed over the semiconductor die 16, and covers the semiconductor die 16 and the conductive wires 26 to form a package body. The encapsulation layer 30 may be formed by a molding underfill process, and the encapsulation layer 30 may substantially fill any spaces between an upper surface of the encapsulation layer 30 and the first surface 213 of the substrate 212. In some embodiments, the encapsulation layer 30 may further be provided on side surfaces of the substrate 212 and/or on portions of the second surface 215 of the substrate 212.

The encapsulation layer 30 is an electrically insulating material that protects the electrical components 14, semiconductor die 16, conductive wires 26, first surface 213 of the substrate 212, and any other electrical components or wiring from damage. In one or more embodiments, the encapsulation layer 30 is a molding compound, which may include, for example, a polymer resin.

In various embodiments of semiconductor packages provided herein, a semiconductor die is stacked over one or more surface mounted electrical components. The electrical components may serve as pillars for mounting the semiconductor die, which facilitates better package integration and miniaturization. Additional advantages are achieved by the various embodiments provided herein. For example, an impedance profile between a semiconductor die and capacitors that are stacked below the semiconductor die is significantly improved as compared to packages having the capacitors positioned along a periphery of a top metal layer of a substrate and spaced apart laterally from the die. This is because a more direct electrical connection (e.g., a shorter conductive path) is possible in embodiments where the capacitors are positioned below the die.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
coupling a first electrical component and a second electrical component to a surface of a substrate;
coupling a non-active silicon spacer to a region of the surface of the substrate spaced laterally inward from the first electrical component and the second electrical component; and
coupling a central portion of an active die to the non-active silicon spacer with a first adhesive layer, the active die having a width greater than a width of the non-active silicon spacer and including a peripheral overhang portion spaced laterally outward from the central portion at least partially overlying the first electrical component and the second electrical component, the first adhesive layer being spaced apart from the first electrical component and the second electrical component, and the first adhesive layer at least partially overlying the first electrical component and the second electrical component;
wherein the non-active silicon spacer is electrically inactive and is not in electrical communication with the active die.

2. The method of claim 1, further comprising:
coupling a first end of an electrical connection to the active die; and
coupling a second end of the electrical connection to the substrate between the second electrical component and an outermost edge of the active die.

3. The method of claim 1, further comprising forming an encapsulation material on the non-active silicon spacer, the active die, and the first and second electrical components.

4. The method of claim 1, further comprising:
forming a molding compound between a surface of the substrate and a surface of the active die that faces towards the surface of the substrate by an underfill process, the forming the molding compound including:
covering a plurality of sidewalls of the non-active silicon spacer with the molding compound spaced inwardly from a plurality of sidewalls of the active die;
covering the plurality of sidewalls of the active die with the molding compound; and
covering sidewalls of the first and second electrical component.

5. The method of claim 1, further comprising:
coupling a third electrical component and a fourth electrical component to the surface of the substrate, each of the third and fourth electrical components spaced outwardly from a respective sidewall of the active die;
forming a plurality of wires electrically coupling the active die to the substrate having ends between sidewalls of a plurality of sidewalls of the active die and the third and fourth electrical components, respectively;
forming a molding compound between the substrate and the active die by an underfill process, the forming the molding compound including:
covering a plurality of sidewalls of the non-active silicon spacer with the molding compound spaced inwardly from the plurality of sidewalls of the active die;
covering the plurality of sidewalls of the active die with the molding compound;

covering sidewalls of the first, second, third, and fourth electrical components with the molding compound; and covering the plurality of wires with the molding compound.

6. The method of claim 1, wherein:

coupling the non-active silicon spacer to the surface of the substrate includes coupling the non-active silicon spacer to the surface of the substrate by a second adhesive layer; and coupling the non-active silicon spacer to the surface of the substrate includes positioning the non-active silicon spacer between the first electrical component and the second electrical component.

7. A method, comprising:

coupling a first electrical discrete component to a surface of a substrate;

coupling a non-active silicon spacer devoid of electrical circuitry to the surface of the substrate with a first adhesive layer; and coupling a central region of an active die having a width greater than a width of the non-active silicon spacer to the non-active silicon spacer with a second adhesive layer, the coupling the central region of the active die to the non-active silicon spacer including:

covering the non-active silicon spacer with a central portion of the active die; and overlapping the first electrical discrete component with a peripheral overhang portion of the active die extending outward from the central portion of the active die; and overlapping the first electrical discrete component with the second adhesive layer, and the second adhesive layer being spaced apart from the first electrical discrete component.

8. The method of claim 7, further comprising coupling a second electrical discrete component to the surface of the substrate spaced apart from the first electrical discrete component by the non-active silicon spacer, and wherein coupling the die to the non-active silicon spacer further includes covering the second electrical discrete component with the peripheral overhang portion of the active die.

9. The method of claim 8, further comprising:

coupling a first end of an electrical connection to the active die; and coupling a second end of the electrical connection to the substrate between the second electrical discrete component and an outermost edge of the active die.

10. The method of claim 7, further comprising forming a molding compound on the non-active silicon spacer, the active die, and the first electrical discrete component.

11. The method of claim 7, further comprising:

forming a molding compound between a surface of the substrate and a surface of the active die that faces towards the surface of the substrate by an underfill process, forming the molding compound including:

covering a plurality of sidewalls of the non-active silicon spacer with the molding compound spaced inwardly from a plurality of sidewalls of the active die;

covering the plurality of sidewalls of the active die with the molding compound; and covering sidewalls of the first electrical discrete component.

12. The method of claim 7, wherein coupling the active die to the non-active silicon spacer includes coupling the active die to the non-active silicon spacer by the second adhesive layer that covers a passive surface of the active die that faces the surface of the substrate.

13. A method, comprising:

coupling a first electrical discrete component to a surface of a substrate;

coupling a second electrical discrete component to the surface of the substrate;

coupling a non-active dummy die spacer devoid of electrical circuitry to the surface of the substrate, the non-active dummy die spacer being between the first and second electrical discrete components;

coupling a central portion of an active die to the non-active dummy die spacer by a first adhesive layer, at least partially overlapping the first and second electrical discrete components with a peripheral overhang portion of the active die that extends laterally outward from the central portion of the active die, and spacing the first adhesive layer apart from the first and second discrete electrical components; and forming a molding compound between a surface of the substrate and a surface of the active die that faces towards the surface of the substrate by an underfill process, forming the molding compound includes:

covering a plurality of sidewalls of the non-active dummy die spacer with the molding compound spaced inwardly from a plurality of sidewalls of the active die;

covering the plurality of sidewalls of the active die with the molding compound; and covering sidewalls of the first and second electrical discrete components.

14. The method of claim 13, further comprising:

coupling the active die to a surface of the non-active dummy die spacer facing away from the substrate and fully overlapping the non-active dummy die spacer with the active die.

15. The method of claim 13, further comprising coupling a first end of a wire to the active die and coupling a second end of the wire opposite to the first end of the wire to the substrate.

16. The method of claim 15, wherein forming the molding compound further includes encasing the active die, the non-active dummy die spacer, the first electrical discrete component, and the wire within the molding compound.

17. The method of claim 13, wherein forming the molding compound further includes encasing the active die, the non-active dummy die spacer, and the first electrical discrete component within the molding compound.

18. The method of claim 13, wherein coupling the non-active dummy die spacer to the surface of the substrate includes coupling the non-active dummy die spacer to the surface of the substrate with a second adhesive layer.

19. The method of claim 18, wherein coupling the active die to the non-active dummy die spacer further includes coupling the active die to the non-active dummy die spacer defining an overhang region of the active die extending outward from a peripheral edge of the non-active dummy die spacer fully overlapping the first electrical discrete component and the second electrical discrete component.

* * * * *